(12) United States Patent
Yoda

(10) Patent No.: US 7,390,079 B2
(45) Date of Patent: Jun. 24, 2008

(54) DEVICE MOUNTING STRUCTURE, DEVICE MOUNTING METHOD, ELECTRONIC APPARATUS, LIQUID DROPLET EJECTION HEAD, AND LIQUID DROPLET EJECTION APPARATUS

(75) Inventor: Tsuyoshi Yoda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/502,962

(22) Filed: Aug. 11, 2006

(65) Prior Publication Data

US 2007/0042613 A1 Feb. 22, 2007

(30) Foreign Application Priority Data

Aug. 19, 2005 (JP) ............................. 2005-238337

(51) Int. Cl.
*B41J 2/045* (2006.01)
*B41J 2/155* (2006.01)
(52) U.S. Cl. ............................. 347/68; 347/42; 347/63; 347/64
(58) Field of Classification Search ............. 347/68–72, 347/63, 64, 203, 206
See application file for complete search history.

(56) References Cited

U.S. PATENT DOCUMENTS 6,497,477 B1 * 12/2002 Nakamura et al. ............ 347/70
2003/0112300 A1 * 6/2003 Chung et al. ................. 347/71
2003/0117464 A1 * 6/2003 Miyata ........................ 347/71
2003/0210306 A1 * 11/2003 Takahashi et al. ............. 347/68
2004/0113992 A1 * 6/2004 Drury et al. .................. 347/68
2005/0285909 A1 * 12/2005 Murata et al. ................ 347/70
2006/0023033 A1 * 2/2006 Ito ............................... 347/71
2006/0227179 A1 * 10/2006 Temple et al. ................ 347/68

FOREIGN PATENT DOCUMENTS

| JP | 2000-127404 | 5/2000 |
|---|---|---|
| JP | 2002-103614 | 4/2002 |
| JP | 2003-25593 | 1/2003 |
| JP | 2003-159800 | 6/2003 |
| JP | 2004-284176 | 10/2004 |

* cited by examiner

*Primary Examiner*—Matthew Luu
*Assistant Examiner*—Joshua M Dubnow
(74) *Attorney, Agent, or Firm*—Harness, Dickey & Pierce, P.L.C.

(57) ABSTRACT

A device mounting structure includes: a base; a unit having a mounting area on which a device is mounted; a projection formed on a face of the unit; a first wiring disposed on the unit and between a top part of the projection and the mounting area; a groove provided in the base, the groove incorporating at least part of the projection; and a second wiring disposed at a bottom part of the groove in the base and electrically connected to the first wiring. The first wiring has a resin layer containing metallic particles, and a metal film on the resin layer.

11 Claims, 11 Drawing Sheets

DEVICE MOUNTING STRUCTURE, DEVICE MOUNTING METHOD, ELECTRONIC APPARATUS, LIQUID DROPLET EJECTION HEAD, AND LIQUID DROPLET EJECTION APPARATUS

CROSS-REFERENCE TO RELATED APPLICATION

This application claims priority to Japanese Patent Application No. 2005-238337, filed Aug. 19, 2005, the contents of which are incorporated herein by reference.

BACKGROUND

1. Technical Field

The present invention relates to a device mounting structure, device mounting method, electronic apparatus, liquid droplet ejection head, and liquid droplet ejection apparatus.

2. Related Art

As a method for disposing and electrically connecting a drive device such as an IC chip on a circuit board, the wire bonding method has been known for some time now. For example, even with respect to liquid droplet ejection heads (ink jet recording heads) used in the case of application of the liquid droplet ejection method (ink jet method) when forming images and manufacturing micro devices, a wire bonding method is used to connect piezoelectric elements for conducting ink ejection operations and a drive circuit (IC chip or the like) for supplying electrical signals to the piezoelectric elements (for example, see Japanese Unexamined Patent Application, First Publication No. 2003-159800 and Japanese Unexamined Patent Application, First Publication No. 2004-284176).

In conjunction with the ever higher integration of IC chips and the like in recent years, there has been a tendency for the external connection terminal of the IC chip and the like to become ever narrower, and to be given an increasingly narrow pitch. In this regard, there has also been a tendency to give an increasingly narrow pitch to the wiring patterns formed on the base substrate. Consequently, application of a connection method using the aforementioned wire bonding has become increasingly difficult.

Moreover, with respect to methods conducting image formation and micro device manufacture based on the liquid droplet ejection method, in order to realize increasingly minute detailing of the image or miniaturization of the micro device, it is preferable to make the distance between the nozzle apertures provided in the liquid droplet ejection head (the nozzle pitch) as small (narrow) as possible. As piezoelectric elements are multiply formed corresponding to the nozzle apertures, if the nozzle pitch is made small, the distance between the piezoelectric elements must also be made small, corresponding to the nozzle pitch. If the distance between the piezoelectric elements is made small in this manner, connection of the plurality of respective piezoelectric elements and the driver IC by the wire bonding method is difficult.

Furthermore, in conjunction with the increasingly compact size of electronic apparatuses, there is a growing need to electrically connect the device and the wiring of the base substrate via a step difference of the IC chip or the like in the device, or a step difference derived from the formation of the base substrate.

SUMMARY

An advantage of some aspects of the invention is to offer a device mounting structure enabling application that is suited to wiring connection via step difference and the increasingly narrow pitch of wiring.

A device mounting structure according to an aspect of the invention includes: a base; a unit having a mounting area on which a device is mounted; a projection formed on a face of the unit; a first wiring disposed on the unit and between a top part of the projection and the mounting area, the first wiring having a resin layer containing metallic particles and a metal film on the resin layer; a groove provided in the base, the groove incorporating at least part of the projection; and a second wiring disposed at a bottom part of the groove in the base and electrically connected to the first wiring.

According to this device mounting structure, the unit and the base are electrically connected by inserting the projection of the unit on which the device is mounted into the groove in the base. That is, electrical connection can be reliably effected even in the case where the bottom part of the groove in the base is the electrically connected part. Moreover, it is easy to realize increasingly minute detailing of the first wiring provided in the unit, and narrower pitches of the wiring can be suitably accommodated.

In addition, simplification of the manufacturing process is fostered by having the first wiring provided in the unit include a resin layer containing metallic particles and a metal film. Furthermore, the resin layer of the first wiring functions as a buffer layer that absorbs positional slippage (height irregularities and the like) when electrically connecting the unit and the base, and contributes to improvement of connection reliability. As a result, with the device mounting structure of the present invention, narrower pitches are accommodated, and highly reliable, highly efficient and low-cost device mounting is realized.

In the device mounting structure of the present invention, the resin layer and the metal film respectively contain a plurality of elongated patterns. By this means, the positional slippage of multiple electrical connection locations is reliably absorbed by the resin layer.

In the device mounting structure of the present invention, the resin layer is planar, and the metal film contains a plurality of elongated patterns formed on top of the resin layer. By this means, the positional slippage of multiple electrical connection locations is reliably absorbed by the resin layer, and simplification of the manufacturing process is fostered.

In the device mounting structure of the present invention, for example, the metallic particles contained in the resin layer are material composed from one or more elements selected from the group consisting of Pd, Pt, and Au. By this means, a metal film that closely adheres to the resin layer is formed.

In the device mounting structure of the present invention, the metal film is formed by a plating method. By this means, the metal film is formed by a highly efficient and short treatment process.

In the device mounting structure of the present invention, for example, the formative material of the metal film contains material composed of one or more elements selected from the group consisting of Al, NiCr, Cu, Ni, Au, and Ag.

In the device mounting structure of the present invention, the coefficient of linear expansion of the base and the coefficient of linear expansion of the unit are substantially identical. By this means, peeling of the electrical connection portion accompanying temperature change is prevented.

In the device mounting structure of the present invention, for example, the formative material of the unit is composed of any one selected from the group consisting of ceramics, engineering plastic, glass epoxy, glass, and silicon.

In the device mounting structure of the present invention, the projection of the unit is formed using anisotropic etching. By this means, the projection of the unit is formed by a highly efficient and short treatment process.

A device mounting method according to an aspect of the invention includes: forming a projection on a face of a unit that has a mounting area; disposing a first wiring on the unit and between a top part of the projection and the mounting area; providing a groove in a base; disposing a second wiring at a bottom part of the groove in the base; and incorporating at least part of the projection of the unit into the groove of the base and connecting the first and second wiring, wherein the first wiring has a resin layer containing metallic particles, and a metal film on the resin layer.

According to this device mounting method, the unit and the base are electrically connected by inserting the projection of the unit into the groove of the base. That is, electrical connection can be reliably effected even in the case where the bottom part of the groove in the base is the electrically connected part. Moreover, it is easy to realize increasingly minute detailing of the wiring provided in the unit, and narrower pitches of the wiring can be suitably accommodated.

In addition, simplification of the manufacturing process is fostered by having the wiring provided in the unit include a resin layer containing metallic particles and a metal film. Furthermore, the resin layer of the wiring functions as a buffer layer that absorbs positional slippage (height irregularities and the like) when electrically connecting the unit and the base. As a result, with the device mounting method of the present invention, narrower pitches are accommodated, and highly reliable, highly efficient and low-cost device mounting is realized.

In the device mounting method of the present invention, said wiring formation process includes a process which forms multiple elongated patterns composed of the resin layer on top of the unit, and a process which forms the metal film on top of each of the multiple elongated patterns. By this means, the positional slippage of multiple electrical connection locations is reliably absorbed by the resin layer.

In the device mounting method of the present invention, the wiring formation process further includes a process which exposes the metallic particles on the surface of the multiple elongated patterns composed of the resin layer. By this means, the metal film reliably and closely adheres to the surface of the resin layer.

In the device mounting method of the present invention, the wiring formation process includes a process which forms the resin layer in a planar manner on top of the unit, and a process which forms multiple elongated patterns composed of the metal film on top of the resin layer. By this means, the positional slippage of multiple electrical connection locations is reliably absorbed by the resin layer, and simplification of the manufacturing process is fostered.

In the device mounting method of the present invention, the wiring formation process is further configured so as to include a process which exposes the metallic particles on the surface of the resin layer in the form of multiple elongated patterns. By this means, the metal film reliably and closely adheres to the surface of the resin layer in multiple elongated patterns.

In the device mounting method of the present invention, the metal film is formed using a plating method. By this means, the metal film is formed by a highly efficient and short treatment process using a plating method.

In the device mounting method of the present invention, for example, the metallic particles contained in the resin layer are made of material composed from one or more elements selected from the group consisting of Pd, Pt, and Au. By this means, a metal film that closely adheres to the resin layer is formed.

In the device mounting method of the present invention, for example, the formative material of the metal film contains material composed of one or more elements selected from the group consisting of Al, NiCr, Cu, Ni, Au, and Ag.

In the device mounting method of the present invention, a projection may be formed on one face of the unit using anisotropic etching. By this means, the projection of the unit is formed by a highly efficient and short treatment process.

In the device mounting method of the present invention, the top part of the projection of the unit and the bottom part of the groove of the substrate are electrically connected using anisotropic conductive material. By this means, it is possible to accommodate narrower pitches, and simplification of the treatment process is fostered.

In the device mounting method of the present invention, the top part of the projection of the unit and the bottom part of the groove of the substrate are electrically connected by ultrasonic joining. By this means, it is possible to accommodate narrower pitches, and simplification of the treatment process is fostered.

An electronic apparatus of the present invention is provided with an electronic device that has been mounted on a base using the aforementioned device mounting structure of the present invention.

In addition, the electronic apparatus of the present invention is provided with an electronic device that has been mounted on a base using the aforementioned device mounting method of the present invention. By this means, one fosters improved mounting efficiency, a more compact size, or lower cost.

A liquid droplet ejection head of the present invention has the aforementioned device mounting structure of the present invention.

In addition, the liquid droplet ejection head of the present invention is manufactured using the aforementioned device mounting method of the present invention.

In addition, the liquid droplet ejection apparatus of the present invention is provided with the aforementioned liquid droplet ejection head of the present invention. By this mean, one fosters more minute detailing of the ejection pitch, a more compact size, or lowered cost.

DESCRIPTION OF EXEMPLARY EMBODIMENTS

Below, an embodiment of the present invention is described with reference to drawings.

In the respective drawings referenced in the following description, in order to facilitate viewing of the drawings, illustration is conducted as necessary with alteration of the dimensions of various components and with partial omissions.

Liquid Droplet Ejection Head

First, the liquid droplet ejection head provided with the device mounting structure pertaining to the present invention is described with reference to FIG. 1 to FIG. 4.

Figure 1:
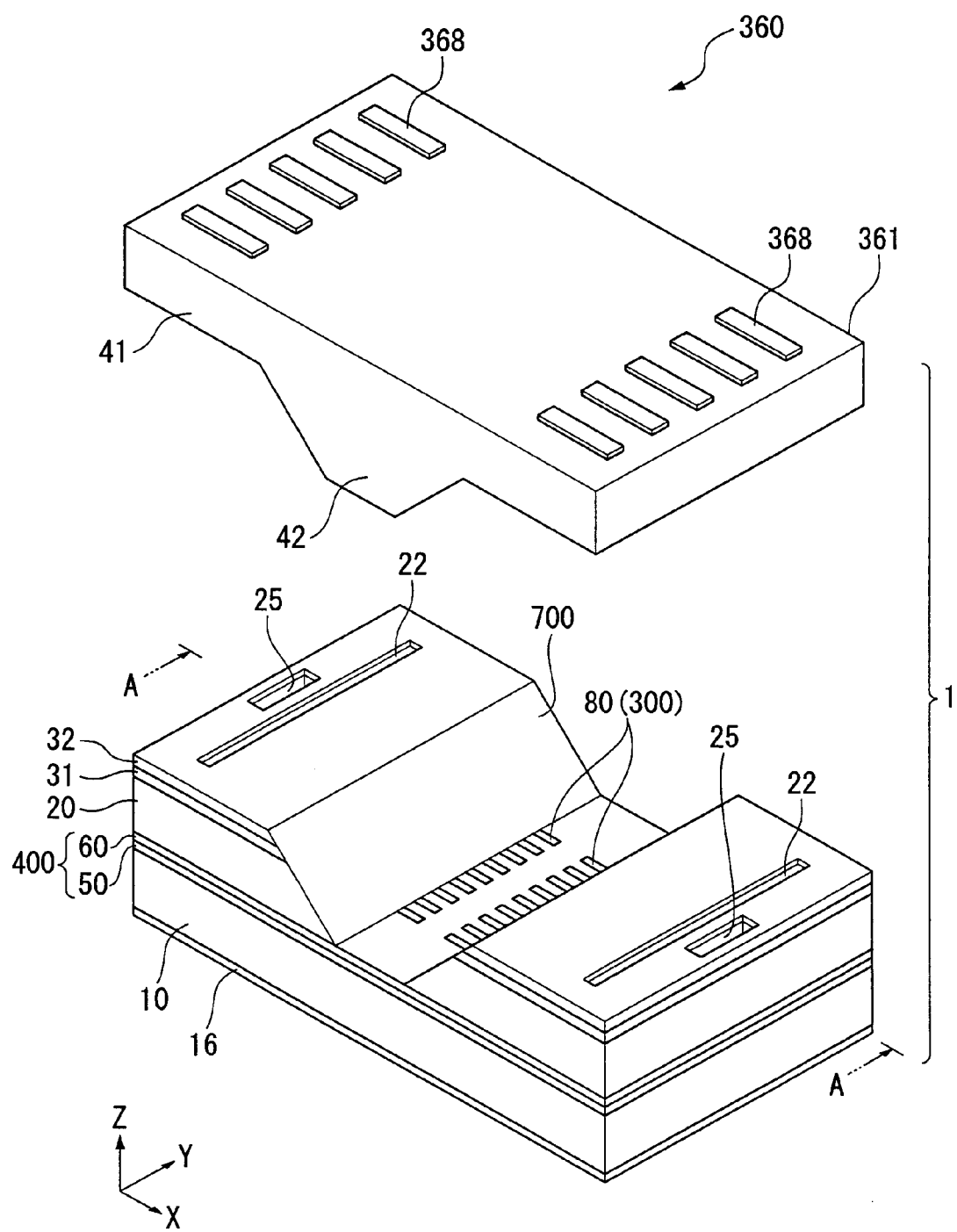
FIG. 1 is an external perspective view of a liquid droplet ejection head.
Figure 2:
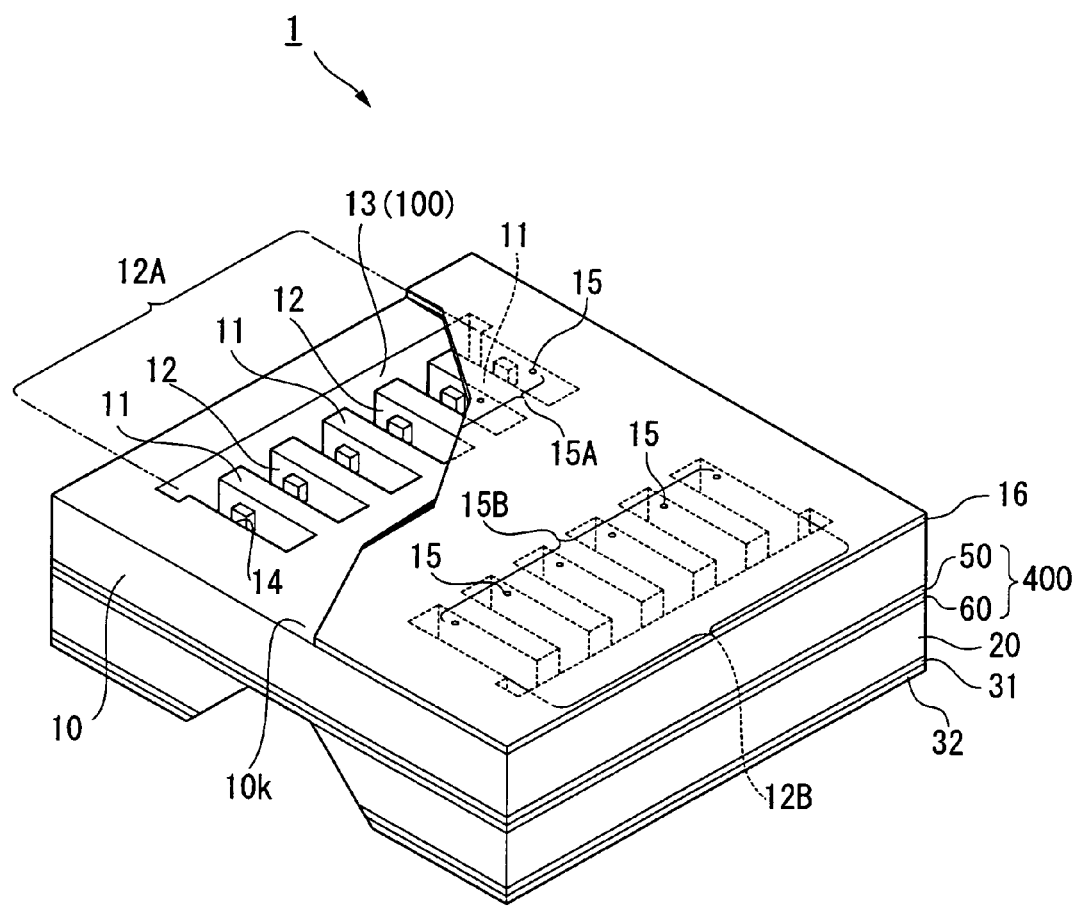
FIG. 2 is a perspective view of the liquid droplet ejection head viewed from the nozzle aperture side.
Figure 3:
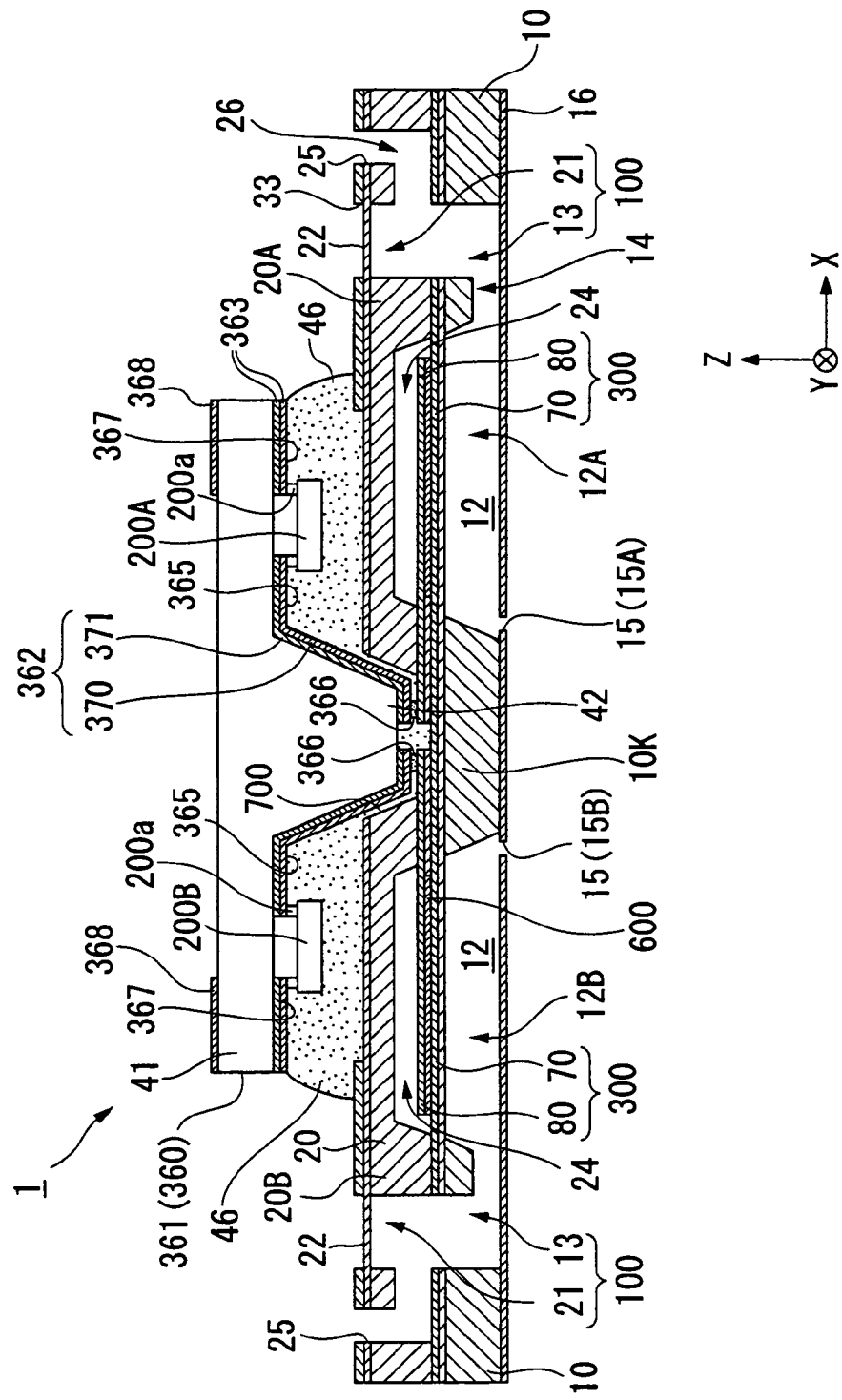
FIG. 3 is a cross-sectional view along the A-A line of FIG. 1.
Figure 4:
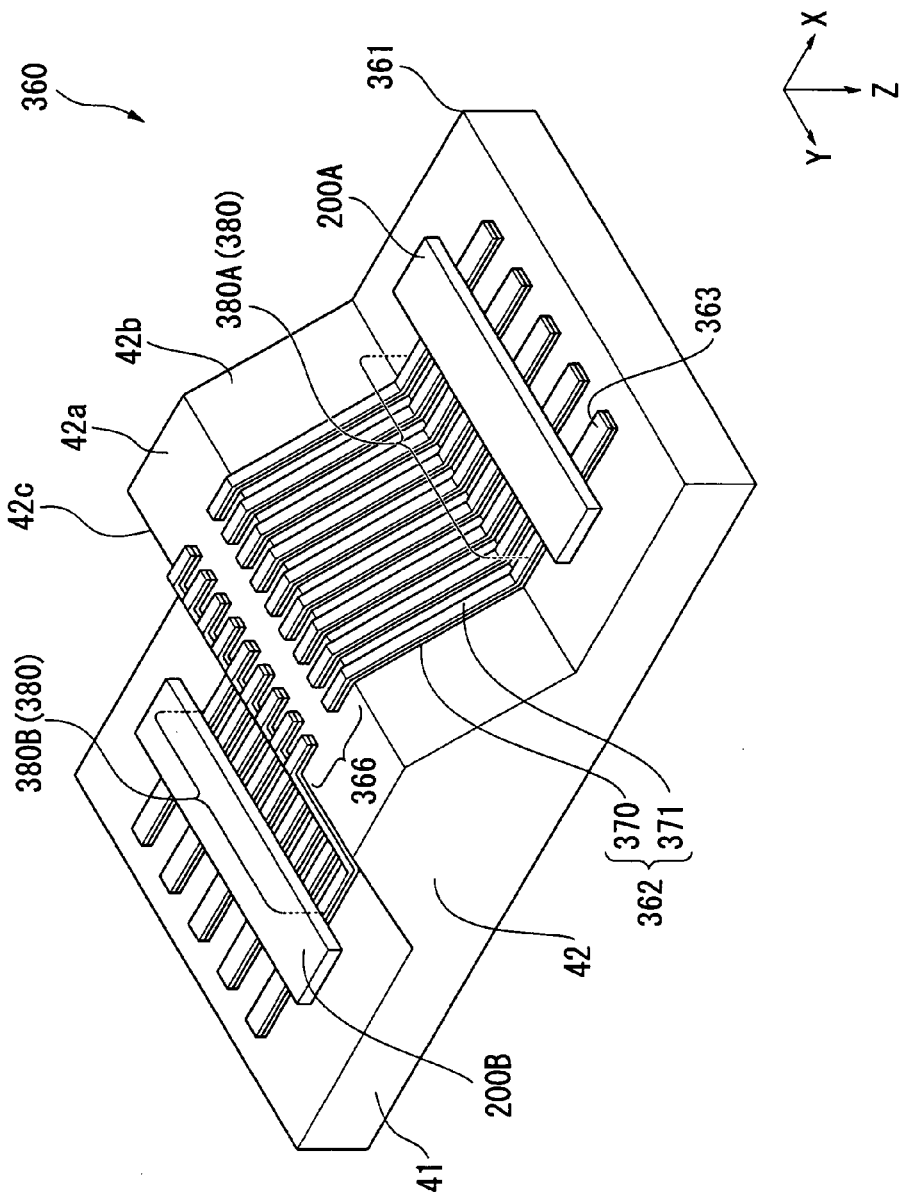
FIG. 4 is an external perspective view of the drive unit.

FIG. 1 is an external oblique view showing one embodiment of the liquid droplet ejection head. FIG. 2 is a partially exploded view of an oblique view of the liquid droplet ejection head seen from the nozzle aperture side. FIG. 3 is a cross-sectional view along the A-A line of FIG. 1. FIG. 4 is an external oblique view of the drive unit.

In the following description, an XYZ orthogonal coordinate system is established, and a description is given of the positional relations of the various members while referring to this XYZ orthogonal coordinate system. A prescribed direction in the horizontal plane is the X axis direction, the direction perpendicular to the X axis direction in the horizontal plane is the Y axis direction, and the direction perpendicular to both the X axis direction and the Y axis direction (i.e., the vertical direction) is the Z axis direction.

As shown in FIG. 1 to FIG. 4, the liquid droplet ejection head 1 ejects liquid droplets of a functional fluid, and is configured from a nozzle substrate 16 having nozzle apertures 15 for liquid droplet ejection, a flow path forming substrate 10 disposed on top of the nozzle substrate 16, a diaphragm 400 disposed on top of a flow path forming substrate 10 and displaced by the driving of piezoelectric elements 300, a reservoir forming substrate 20 disposed on top of the diaphragm 400, drive circuits (IC drivers) 200A and 200B which drive the piezoelectric elements 300, and a drive unit 360 on which the drive circuits 200A and 200B are mounted. The operations of the liquid droplet ejection head 1 are controlled by an external controller that is not illustrated in the drawings.

A pressurizing chamber 12 in which the functional fluid is disposed prior to ejection from the nozzle apertures 15 is formed as a space encompassed by the flow path forming substrate 10, nozzle substrate 16, and diaphragm 400. In addition, a reservoir 100 which holds in reserve the functional fluid before it is supplied to the pressurizing chamber 12 is formed by the space encompassed by the flow path forming substrate 10 and reservoir forming substrate 20. The base of the present invention is configured by the aforementioned flow path forming substrate 10 and reservoir forming substrate 20.

As shown in FIG. 2, the nozzle substrate 16 is arranged so as to cover the openings provided in one face of the flow path forming substrate 10. The flow path forming substrate 10 and nozzle substrate 16 are fixed, for example, via an adhesive agent or thermo-deposition film or the like. Nozzle apertures 15 for ejecting liquid droplets are provided in the nozzle substrate 16. Multiple nozzle apertures 15 are provided in the nozzle substrate 16. Specifically, the nozzle substrate 16 is provided with a first nozzle aperture group 15A and second nozzle aperture group 15B composed from multiple nozzle apertures 15 provided in parallel in the Y axis direction. The first nozzle aperture group 15A and second nozzle aperture group 15B are arranged so as to be mutually opposite in the X axis direction.

FIG. 2 shows the respective nozzle aperture groups 15A and 15B are each composed of six nozzle apertures 15, but actually the respective nozzle aperture groups are, for example, composed of a large number of nozzle apertures 15 on the order of 720 openings.

A plurality of partitions 11 are formed on the inner side of the flow path forming substrate 10. The flow path forming substrate 10 is formed from silicon, and the plurality of partitions 11 are formed by conducting anisotropic etching of the silicon monocrystal substrate which is the matrix of the flow path forming substrate 10. As the monocrystal silicon, one may use material having a tapered cross-section where the crystal orientation plane is a (100) plane, or material having a rectangular cross-section where the crystal orientation plane is a (110) plane. A plurality of pressurizing chambers 12 are then formed as spaces encompassed by the flow path forming substrate 10 having multiple partitions 11, the nozzle substrate 16, and the diaphragm 400. A plurality of pressurizing chambers 12 are formed so as to correspond to the plurality of nozzle apertures 15. That is, the pressurizing chambers 12 are multiply disposed in parallel in the Y axis direction so as to correspond to the multiple nozzle apertures 15 composing each of the first and second nozzle aperture groups 15A and 15B. A first pressurizing chamber group 12A is configured from the multiple pressurizing chambers 12 formed corresponding to the first nozzle aperture group 15A. A second pressurizing chamber group 12B is configured from the multiple pressurizing chambers 12 formed corresponding to the second nozzle aperture group 15B. The first pressurizing chamber group 12A and second pressurizing chamber group 12B are arranged so as to be mutually opposite in the X axis direction, with the partition 10K formed in between them.

As shown in FIG. 2, with respect to the plurality of pressurizing chambers 12 forming the first pressurizing chamber group 12A, the terminus of the −X side is blocked by the aforementioned partition 10K, but at the terminus on the +X side, they connect to each other and to the reservoir 100 (see FIG. 3).

As shown in FIG. 3, the reservoir 100 temporarily retains the functional fluid before it is introduced from the functional fluid introduction port 25, and supplied to the pressurizing chambers 12. The reservoir 100 is provided with a reservoir portion 21 formed in the reservoir forming substrate 20 so as to extend in the Y axis direction, and a communicating part 13 which connects the reservoir portion 21 with the respective pressurizing chambers 12. That is, the reservoir 100 is a functional fluid retainer (ink chamber) that is common to the multiple pressurizing chambers 12 composing the first pressurizing chamber group 12A. The functional fluid introduced from the functional fluid introduction port 25 flows into the reservoir 100 through the introduction path 26, and is subsequently supplied to each of the multiple pressurizing chambers 12 composing the first pressurizing chamber group 12A through the supply path 14.

In addition, a reservoir 100 identical to the above is also connected to the pressure producing chambers 12 composing the second pressurizing chamber group 12B.

The diaphragm 400 disposed between the flow path forming substrate 10 and the reservoir forming substrate 20 is provided with an elastic film 50 covering one face of the flow path forming substrate 10, and a lower electrode film 60 provided on top of the elastic film 50. The elastic film 50 is formed, for example, from silicon dioxide with a thickness on the order of 1 to 2 μm. The lower electrode film 60 is composed, for example, from metal with a thickness on the order of 0.2 μm. In the present embodiment, the lower electrode film 60 is a shared electrode of the plurality of piezoelectric elements 300.

The piezoelectric element 300 which serves to displace the diaphragm 400 is provided with a piezoelectric body film 70 provided on top of the lower electrode film 60, and an upper electrode film 80 provided on top of the piezoelectric body film 70. The piezoelectric body film 70 has a thickness, for example, of 1 μm, and the upper electrode film 80 has a thickness, for example, of 0.1 μm. In conceiving the piezoelectric element 300, it is also acceptable to include the lower electrode film 60, in addition to the piezoelectric body film 70 and upper electrode film 80. That is, the lower electrode film 60 of the present embodiment is jointly endowed with a function as the piezoelectric element 300 and a function as the diaphragm 400. Moreover, in the present embodiment, the elastic film 50 and lower electrode film 60 function as the diaphragm 400, but it is also acceptable to have a structure that omits the elastic film 50, and to have the lower electrode film 60 also serve as an elastic film (50).

A plurality of piezoelectric body films 70 and upper electrode films 80 (i.e., piezoelectric elements 300) are disposed so as to correspond to the respective plurality of nozzle apertures 15 and pressurizing chambers 12. That is, a piezoelectric element 300 is provided for each nozzle aperture 15 (and for each pressurizing chamber 12). As mentioned above, the lower electrode film 60 functions as a shared electrode of the plurality of piezoelectric elements 300, and the upper electrode films 80 function as separate electrodes of the plurality of piezoelectric elements 300.

A first piezoelectric element group is configured by the plurality of piezoelectric elements 300 aligned in the Y axis direction corresponding to the respective nozzle apertures 15 of the first nozzle aperture group 15A. A second piezoelectric element group is configured by the plurality of piezoelectric elements 300 aligned in the Y axis direction corresponding to the respective nozzle apertures 15 of the second nozzle aperture group 15B. The first piezoelectric element group and second piezoelectric element group are arranged so as to be mutually opposite in the X axis direction.

A compliance substrate 30 having a sealing film 31 and fixing plate 32 is joined to the top of the reservoir forming substrate 20. The sealing film 31 is composed of material of low rigidity which is flexible (e.g., polyphenylene sulfide film with a thickness of 6 μm). The reservoir portion 21 is sealed by this sealing film 31. The fixing plate 32 is formed from hard material such as metal (e.g., stainless steel with a thickness of 30 μm). In this fixing plate 32, the region corresponding to the reservoir 100 is an aperture 33 that is completely excised in the thickness direction. Consequently, the upper part of the reservoir 100 is sealed only by the flexible sealing film 31, and constitutes a flexible part 22 capable of deformation according to changes in internal pressure.

When the functional fluid is supplied to the reservoir 100 from the functional fluid introduction port 25, a pressure change occurs inside the reservoir 100 by, for example, the flow of the functional fluid during the driving of the piezoelectric element 300, or by the ambient heat or the like. As mentioned above, given that the upper part of the reservoir 100 is sealed by the flexible sealing film 31 (flexible part 22), the flexible part 22 bends and flexes, and absorbs the pressure change. Accordingly, the interior of the reservoir 100 is constantly maintained at a fixed pressure. The other parts are maintained at sufficient strength by the fixing plate 32.

The functional fluid introduction port 25 which supplies functional fluid to the reservoir 100 is formed on top of the compliance substrate 30 on the outer side of the reservoir 100. The introduction path 26 which communicates with the functional fluid introduction port 25 and side wall of the reservoir 100 is provided in the reservoir forming substrate 20.

A groove (concave part) 700 is formed in the central part of the reservoir forming substrate 20 in the X axis direction, and extends in the Y axis direction. The groove 700 has a tapered form in which its diameter contracts as its cross-section heads downward.

The reservoir forming substrate 20 contains a first sealed part 20A and second sealed part 20B which are divided by interposition of the groove 700. The first sealed part 20A seals the plurality of piezoelectric elements 300 that connect to the drive circuit 200A. The second sealed part 20B seals the plurality of piezoelectric elements 300 that connect to the drive circuit 200B. The first sealed part 20A and second sealed part 20B respectively secure space in regions facing the piezoelectric elements 300 to an extent that does not impede the movement (driving) of the piezoelectric elements 300, and respectively possess a piezoelectric element retainer (element retainer) 24 that seals the space. Of the piezoelectric elements 300, at least the piezoelectric body films 70 are sealed inside this piezoelectric element retainer 24. The piezoelectric element retainer 24 may have a configuration that seals the entirety of the piezoelectric elements 300 included in the respective piezoelectric element groups, or it may have a configuration that separately seals each of the piezoelectric elements 300.

In this manner, the reservoir forming substrate 20 has the function of shielding the piezoelectric elements 300 from the external environment, and sealing the piezoelectric elements 300. By sealing the piezoelectric elements 300 by means of the reservoir forming substrate 20, deterioration of the piezoelectric elements 300 due to external environmental factors such as moisture is prevented. In addition, in the present embodiment, as a result of a configuration that establishes a sealed state inside the piezoelectric element retainer 24 by, for example, creating a vacuum or by creating a nitrogen or argon atmosphere or the like in the space inside the piezoelectric element retainer 24, the interior of the piezoelectric element retainer 24 is maintained at low humidity, and it is possible to more reliably prevent deterioration of the piezoelectric elements 300.

The reservoir forming substrate 20 is a rigid body. As the formative material of the reservoir forming substrate 20, it is preferable to use, for example, a material that has a coefficient of thermal expansion substantially identical to that of the flow path forming substrate 10 such as glass or ceramics. In the present embodiment, a monocrystal silicon substrate, the same material as that of the flow path forming substrate 10, is used. In the case where a monocrystal silicon substrate is used, it is possible to easily conduct high-precision work by anisotropic etching, and formation of the piezoelectric element retainer 24 and groove (concave part) 700 is facilitated.

As shown in FIG. 3, of the piezoelectric elements 300 sealed in the piezoelectric element retainer 24 of the first sealed part 20A, the terminus on the −X side of the upper electrode film 80 extends toward the outer side of the first sealed part 20A, and is disposed inside the groove 700 of the reservoir forming substrate 20. Similarly, of the piezoelectric elements 300 sealed in the piezoelectric element retainer 24 of the second sealed part 20B, the terminus on the +X side of the upper electrode film 80 extends toward the outer side of the second sealed part 20B, and is disposed inside the groove 700 of the reservoir forming substrate 20. In each case, an insulating film 600 is arranged between the lower electrode film 60 and the extending portion of the upper electrode film 80.

As shown in FIG. 4, the drive unit 360 possesses a unit base material 361, wirings 362 and 363, and drive circuits 200A and 200B. The unit base material 361 includes a rectangular-shaped flat plate (substrate part) 41, and a projection 42 provided on the mounting face of the respective drive circuits 200A and 200B on the flat plate 41. The projection 42 is disposed on the central part of the flat plate 41 in the widthwise direction (Y axis direction). Moreover, the projection 42 is formed so that the diameter contracts as it becomes more distant from the flat plate 42 (the longitudinal section is trapezoidal), and possesses a flat top face 42a, and two flat inclined faces 42b and 42c.

The wiring 362 includes a plurality of elongated patterns (linear patterns) 380 that continuously extend between a prescribed position on the flat plate 41 (the mounting position of the drive circuits 200A and 200B) and the top face 42a of the projection 42. That is, in addition to being arranged on the flat plate 41 and the top face 42a of the projection 42 of the unit base material 361, the wiring 362 is also arranged on the inclined faces 42b and 42c of the projection 42. Each of the plurality of elongated patterns 380 are mutually parallel, and are aligned at a prescribed pitch in the Y direction. The terminus of the wiring 362 is a terminal 365 (see FIG. 3) or a terminal 366. The terminal 365 is electrically connected to the drive circuits 200A and 200B, and the terminal 366 is electrically connected to the upper electrode film 80 configuring the piezoelectric elements 300.

In addition, the wiring 362 includes a resin layer 370 containing metallic particles, and a metal film 371 on top of the resin film 370. The metallic particles contained in the resin film 370 are the growth nucleus (or growth catalyst) of the metal film 371. As the metallic particles contained in the resin layer 370, there is, for example, Pd (palladium), Pt (platinum), Au (gold), and so on. These may be used alone, or in combination. This resin layer 370 may be formed with high precision using the print method, photolithography method, liquid droplet ejection method or the like. The formative material of the metal film 371 is, for example, Al (aluminum), NiCr (nickel-chrome), Cu (copper), Ni (nickel), Au (gold), and Ag (silver). These may be used alone, or in combination. This metal film 371 may be formed with high precision using the print method, photolithography method, liquid droplet ejection method, plating method or the like. By using the plating method, it is possible to satisfactorily form the metal film 371 using the metallic particles contained in the resin layer 370 as the growth nucleus. It is also acceptable to form other films, such as a barrier film for preventing the dispersion of metallic material, or a film for improving the adhesion of the resin layer 370, between the surface of the unit base material 361 and resin layer 370.

The wiring 363 is formed in the flat plate 41 on the unit base material 361. The terminus of the wiring 363 is a terminal 367 (see FIG. 3) or a terminal 368 (see FIG. 1). The terminal 367 is electrically connected to the drive circuits 200A and 200B, and the terminal 368 is electrically connected to an external controller omitted from the drawings via an external substrate (FPC substrate or the like) on the rear face of the flat plate 41. The wiring 363 may be formed using metal material, conductive polymer, superconductive material and the like.

The drive circuits 200A and 200B are configured to have a semiconductor integrated circuit (IC) containing, for example, a circuit board or a drive circuit. In addition, the drive circuits 200A and 200B have multiple connection terminals 200a (see FIG. 3). The drive circuits 200A and 200B are mounted onto the respective wirings 362 and 363 in the unit base material 361. The connection terminals 200a of drive circuits 200A and 200B are connected to each of the terminals 365 and 367 of the wirings 362 and 363 in the unit base material 361. Drive circuit 200A is disposed lengthwise along the Y axis direction on flat plate 41 (on the drive unit 360), and drive circuit 200B is disposed lengthwise in the Y axis direction substantially parallel with drive circuit 200A.

In the present embodiment, each of the plurality of elongated patterns 380 has a laminate structure including the elongated resin layer 370 and elongated metal film 371. With respect to elongated pattern group 380A shown in FIG. 4, one end thereof (terminal 365) is connected to the drive circuit 200A, and the other end (terminal 366) is connected to the piezoelectric elements 300 of the first piezoelectric element group corresponding to the first nozzle aperture group 15A. With respect to elongated pattern group 380B, one end thereof (terminal 365) is connected to the drive circuit 200B, and the other end (terminal 366) is connected to the piezoelectric elements 300 of the second piezoelectric element group corresponding to the second nozzle aperture group 15B. On the top face 42a of the projection 42 of the unit base material 361, the array pitch of the multiple elongated patterns 380 matches the pitch of the upper electrode film 80 that extends into the groove 700 shown in FIG. 3.

As shown in FIG. 3, the projection 42 of the unit base material 361 is formed into a shape that does not stuff the groove 700 of the reservoir forming substrate 20. In addition, the height (length in the Z direction) of the projection 42 is greater than the depth of the groove 700. More precisely, a size is set so that drive circuits 200A and 200B mounted on the flat plate 41 do not contact the reservoir forming substrate 20, even when the projection 42 of the unit base material 361 is inserted into the groove 700 of the reservoir forming substrate 20.

In the flat plate 41 of the unit base material 361, an alignment mark which is not illustrated in the drawings may be formed as necessary. This alignment mark serves as reference in aligning the drive unit 360 relative to the base (flow path forming substrate 10 and reservoir forming substrate 20). The alignment mark may be formed, for example, using the formation process of the wiring 362.

The unit base material 361 is composed of material that possesses insulation properties at least on its surface. As the unit base material 361, one may cite, for example, ceramics (alumina ceramics or zirconia ceramics), engineering plastic (polycarbonate and polyimide, or crystal polymer and the like), and compacts of insulating material such as glass epoxy and glass. Otherwise, as the unit base material 361, one may also use base material where a silicon oxide film is formed by thermal oxidation on the surface of a base composed of silicon (Si), or base material where an insulating resin layer is formed on the surface of the silicon base. By making the coefficient of thermal expansion of the unit base material 361 substantially identical to the coefficient of thermal expansion of the flow path forming substrate 10 and reservoir forming substrate 20, the occurrence of peeling and the like in the conductive junction part due to the volume change accompanying temperature variations is prevented.

In the present embodiment, a monocrystal silicon substrate, which is the same material as that of the flow path forming substrate 10 and reservoir forming substrate 20, is used as the unit base material 361. For example, as the unit base material 361, a base material is used where the monocrystal silicon substrate (crystal orientation plane is a (100) plane) is partially excised by anisotropic etching, and the projection 42 is formed. As the unit base material 361, when a compact of glass epoxy, ceramics, or engineering plastic is used, it is possible to obtain superior shock resistance and the like in comparison to the case where a silicon base is used.

As shown in FIG. 3, the drive unit 360 provided with the foregoing configuration is flip-chip mounted onto the upper electrode film 80 of the piezoelectric elements 300 in a state where the projection 42 of the unit base material 361 is inserted into the groove 700 of the reservoir forming substrate 20. That is, the terminal 366 of the top face 42a of the projection 42 of the unit base material 361 is electrically connected to the upper electrode film 80 of the piezoelectric elements 300 on the flow path forming substrate 10. Sealing is conducted between the base (the flow path forming substrate 10 and reservoir forming substrate 20) and the drive circuits 200A and 200B by a non-conductive resin 46 such as epoxy resin. As a result of this sealing, the drive unit 360 and the aforementioned base are integrated as the liquid droplet ejection head 1.

As the mode of flip-chip mounting (conductive connection structure), in addition to intermetallic direct joining by ultrasonic waves or crimping, one may also use joining via an interim conductive material. As the interim conductive material, one may cite anisotropic conductive material including anisotropic conductive film (ACF) and anisotropic conductive paste (ACP), and the like.

As the present embodiment provides the projection 42 for electrical connection to the drive unit 360 in this manner, electrical connection is reliably effected even in the case where the bottom part of the groove 700 in the base (the flow path forming substrate 10 and reservoir forming substrate 20) is the electrical connection part. Consequently, a space to allow winding of wire in wire bonding is unnecessary, and a thinner liquid droplet ejection head 1 is realized.

In addition, in the present embodiment, the projection 42 of the drive unit 360 is incorporated into the groove 700 of the base 10 and 20, and the base 10 and 20 and the drive unit 360 are further integrated by the resin 46. Consequently, the rigidity of the liquid droplet ejection head 1 itself is comparatively high, and declines in ejection accuracy due to warpage or the like are effectively prevented. Moreover, as a result of the humidity proofing effect of the resin 46, deterioration in the properties of the electrical connection parts or piezoelectric elements 300 is prevented.

In addition, in the present embodiment, more minute detailing of the wiring 362 provided in the base material 361 is facilitated, and narrower pitches of the wiring are suitably accommodated. Consequently, this liquid droplet ejection head 1 may be suitably used in minutely detailed image formation and film pattern formation.

In addition, in the present embodiment, as a result of guidance by the inclined faces 42b and 42c of the projection 42 of the drive unit 360, positioning of the drive unit 360 relative to the base 10 and 20 or insertion of the projection 42 of the drive unit 360 into the groove 700 of the base 10 and 20 is facilitated.

In addition, in the present embodiment, as the wiring 362 provided in the base material 361 includes the resin layer 370 containing metallic particles and the metal film 371, the resin layer 370 functions as a buffer layer that absorbs positional slippage (height irregularities and the like) when electrically connecting the drive unit 360 and the aforementioned base 10 and 20. That is, when the projection 42 of the drive unit 360 is pressed against the base 10 and 20, gaps are alleviated by the easy deformation of the resin layer 370. As a result, the reliability of connection between the terminals of the drive unit 360 and the base 10 and 20 is improved.

In addition, in the present embodiment, as the configuration is one where the drive circuits 200A and 200B and the drive unit 360 are flip mounted, improvement of the processing efficiency of the mounting is fostered by use of one and the same device (mounting device).

Next, a description is given of the operations of the liquid droplet ejection head 1 having the aforementioned configuration.

In order to eject liquid droplets of functional fluid from the liquid droplet ejection head 1, an external controller drives an external functional fluid supply device not illustrated in the drawings that is connected to the functional fluid introduction port 25. After the functional fluid that is fed from the external functional fluid supply device is supplied to the reservoir 100 via the functional fluid introduction port 25, it fills the internal flow path of the liquid droplet ejection head 1 until it reaches the nozzle apertures 15. In addition, the external controller transmits drive power and command signals to the drive circuits 200A and 200B. Based on the commands from the external controller, the drive circuits 200A and 200B impress voltage between the lower electrode film 60 and upper electrode film 80 in the piezoelectric elements 300 via the wiring 362. As a result of the displacement of the elastic film 50, lower electrode film 60 and piezoelectric body film 70, the prescribed pressure inside the pressurizing chamber 12 increases, and liquid droplets are ejected from the nozzle apertures 15.

Manufacturing Method of The Liquid Droplet Ejection Head

Figure 5:
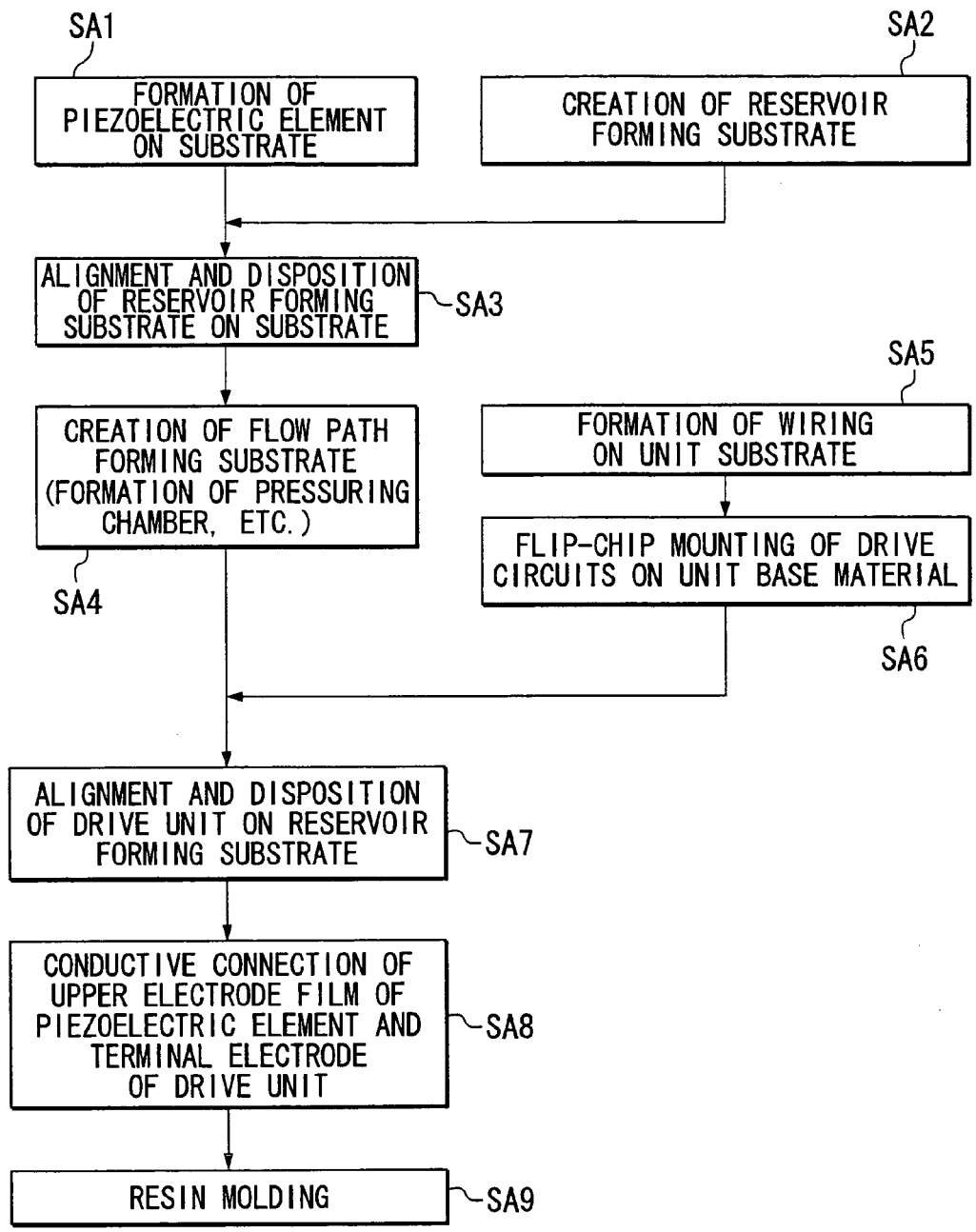
FIG. 5 is a flowchart showing the manufacturing method of the liquid droplet ejection head.

Next, a description is given of one example of the manufacturing method of the liquid droplet ejection head 1 with reference to the flowchart of FIG. 5.

First, laminar formation of the elastic film 50 and lower electrode film 60 is conducted on the monocrystal silicon substrate by the photolithography method or the like, and the piezoelectric element 300 is then formed on top of the lower electrode film 60 by pattern formation of the piezoelectric body film 70 and upper electrode film 80 (step SA1).

Next, in a process separate from step SA2, the piezoelectric element retainer 24, groove 700 and introduction path 26 shown in FIG. 3 are formed on the monocrystal silicon substrate by anisotropic etching or dry etching. The reservoir forming substrate 20 is then produced by forming the reservoir portion 21 on the substrate using dry etching (step SA2).

Next, the reservoir forming substrate 20 that has passed through step SA2 is aligned and disposed on top of the substrate 10 that has passed through step SA1, after which the substrate 10 and reservoir forming substrate 20 are joined (step SA3). Next, the pressurizing chamber 12, communicating part 13, supply path 14 and so on shown in FIG. 3 are formed on the monocrystal silicon substrate by anisotropic etching or dry etching from the rear face of the substrate 10, whereby the flow path forming substrate 10 is produced (step SA 4).

In addition, in a process separate from steps SA1 to SA4, the wiring 362 and 363 is formed on top of the unit base material 361 shown in FIG. 4 (step SA5). Subsequently, the drive circuits 200A and 200B are mounted by flip-chip mounting in the prescribed region (mounting region) on the unit base material 361, and the drive unit 360 is formed (step SA6). The process of forming the wiring 362 on the unit base material 361 is described below in detail.

Next, the drive unit 360 that has passed through step SA6 is aligned and disposed on top of the reservoir forming substrate 20 (step SA7). The alignment is accurately conducted based on the result of observation of the alignment marks formed in the drive unit 360 (unit base material 361) and/or reservoir forming substrate 20.

Next, the projection 42 of the unit base material 361 is inserted into the interior of the groove 700 of the reservoir forming substrate 20 (step SA8). As a result of the incorporation of the projection 42 of the drive unit 360 wherein the terminal 366 is formed on the top face 42a into the groove 700, the wiring 362 of the unit base material 361 and the upper electrode film 80 of the piezoelectric element are electrically connected at the bottom part of the groove 700. To effect this electrical connection (flip-chip mounting), one may use the metal crimping method, the pressurizing and heating method that uses wax or anisotropic conductive material, the ultrasonic vibration method (ultrasonic heating method), and so on. By using anisotropic conductive material, electrical connection that accommodates narrow pitches becomes possible, fostering simplification of the treatment process. Or by using ultrasonic joining (Au-Au joining or the like), electrical connection that accommodates narrow pitches becomes possible, fostering simplification of the treatment process.

Next, sealing is conducted between the drive unit 360 and the reservoir forming substrate 20 with resin mold by means of the non-conductive resin 46 (step SA9).

The liquid droplet ejection head 1 can be manufactured by the foregoing manufacturing process.

Manufacturing Method of The Drive Unit

Figure 6A:
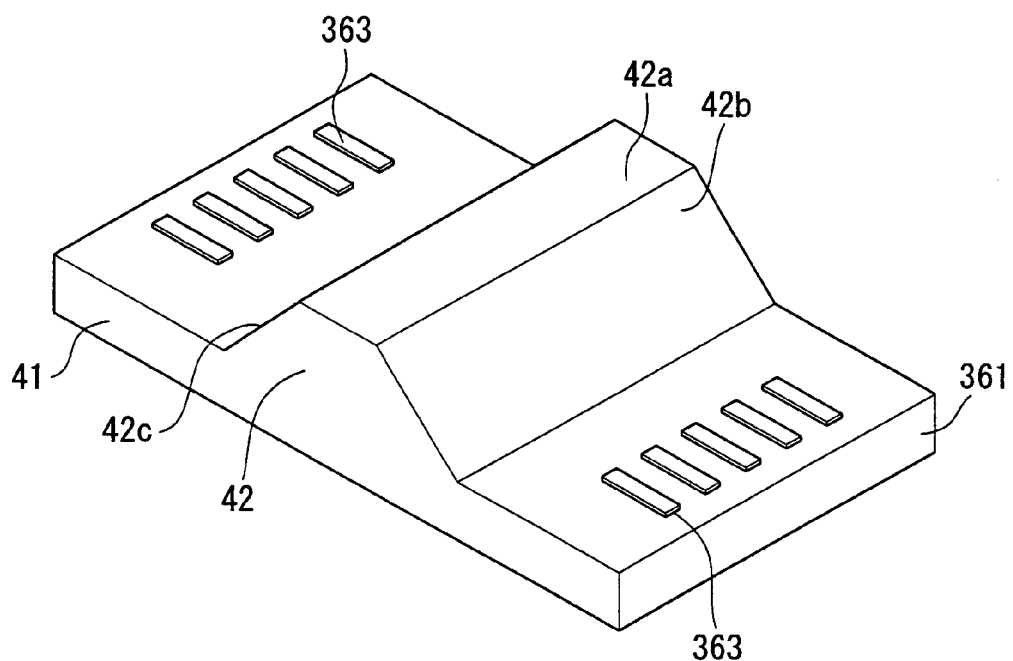
FIGS. 6A, 6B and 6C are explanatory views showing the manufacturing method of the drive unit.
Figure 6B:
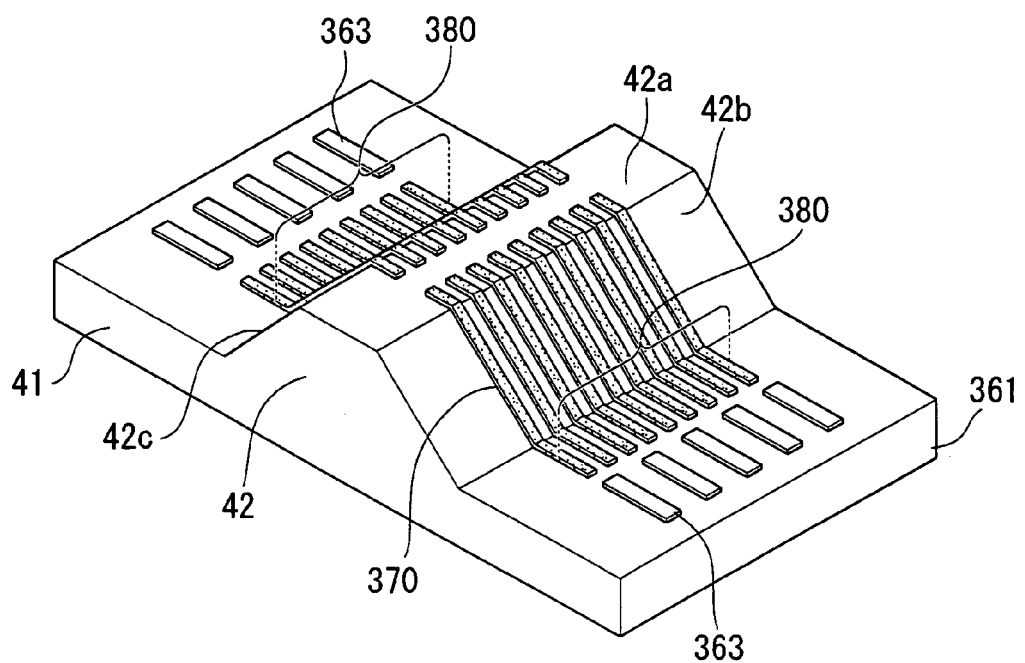
Figure 6C:
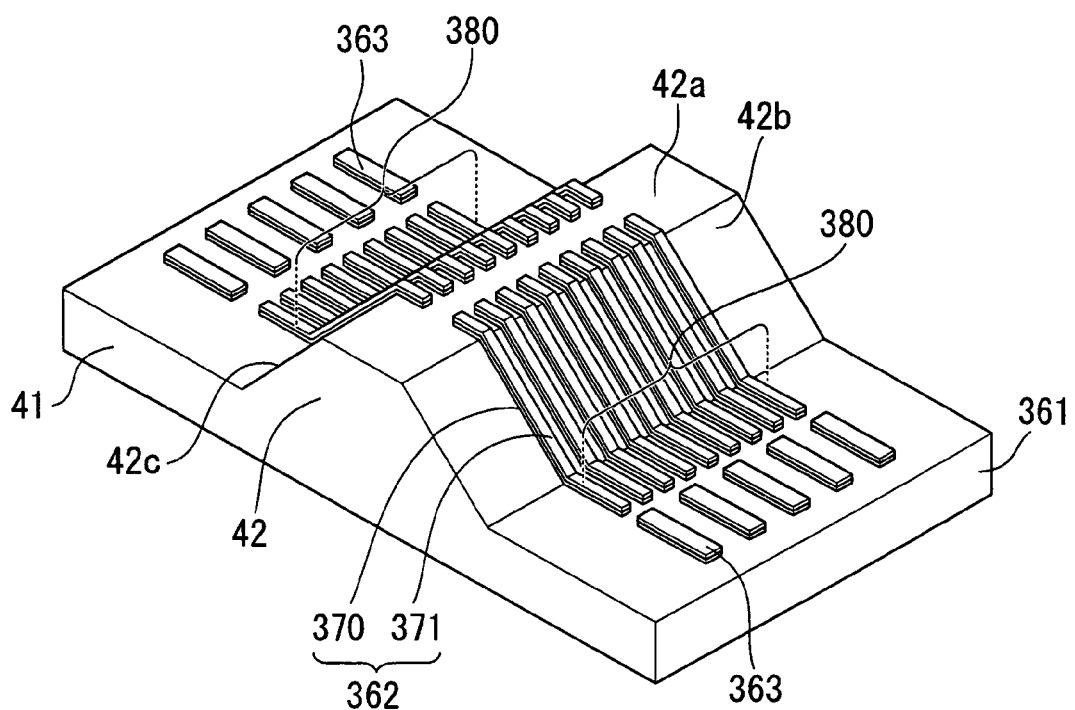

Next, a description is given of the manufacturing method of the drive unit 360 with reference to FIGS. 6A to 6C.

As shown in FIG. 6A, the projection 42 is provided on one face of the flat plate 41 in the unit base material 361. This projection 42 is formed so that its diameter contracts as it becomes more distant from the flat plate 41 (its cross-section is trapezoidal). In addition, the wiring 363 used for external connection is formed on the flat plate 41 of the unit base material 361.

When forming the aforementioned projection 42, for example, after first conducting thermal oxidation of the surface of monocrystal silicon whose crystal orientation plane is a (100) plane, a resist is partially disposed on the surface of the substrate. To conduct the partial disposition of the resist, one may use the photolithography method or the liquid droplet ejection method. The region of disposition of the resist is the region that becomes the top face 42a of the projection 42. Next, the thermal oxidation film is removed by hydrofluoric acid, after which anisotropic etching is conducted using etching fluid such as KOH solution, ethylene diamine solution, or the like. By this means, one forms the tapered projection 42, which has a flat top face 42a protected by the resist, and two flat inclined faces 42b and 42c based on the crystal orientation (angle of inclination approximately 54°), on the silicon substrate.

Next, as shown in FIGS. 6B and 6C, the wiring 362 is formed on top of the unit base material 361. The wiring 362 is formed so as to reach the top face 42a by passing from the flat plate 41 over the inclined faces 42b (42c) of the projection 42. In the present embodiment, after formation of the elongated resin layer 370, the metal film 371 is formed by plating treatment.

First, as shown in FIG. 6B, the resin layer 370 is disposed on top of the unit base material 361. To dispose the resin layer 370, various types of application methods may be used such as the spray method, printing method, and liquid droplet ejection method. The resin layer 370 disposed over the entirety of the surface of the unit base material 361 is patterned into a plurality of elongated patterns 380 by the photolithography process. Or the plurality of elongated patterns 380 (resin layer 370) are formed by direct drawing using the liquid droplet ejection method. Prior to disposition of the resin layer 370, it is also acceptable to treat the surface of the unit base material 361 to make it water repellent or affinity. In addition, drying treatment (curing treatment) of the resin layer 370 may be appropriately conducted at a timing of one's choice. As the metallic particles contained in the resin layer 370, one may use, for example, Pd (palladium), Pt (platinum), Au (gold) and the like. In the present embodiment, Pd is used.

After the plurality of elongated patterns 380 (resin layer 370) have been formed, the metallic particles (Pd) are exposed on the surface of the plurality of elongated patterns 380. To conduct this exposure treatment, one may use write etching by RIE, heat treatment, or the like. The metallic particles (Pd) are exposed on the surface of the resin layer 370 by removing the resin on the surface of the resin layer 370 by etching, or by melting the resin on the surface of the resin layer 370 by heat treatment.

Next, as shown in FIG. 6C, the metal film 371 is formed on top of the plurality of elongated patterns 380 (resin layer 370). In this case, a plating method is used to form the metal film 371. In conducting plating treatment, it is possible to apply various types of plating methods such as the non-electrolytic plating method and electrolytic plating method. The metallic particles (Pd) exposed on the surface of the resin layer 370 constitute the growth nucleus of the metal film 371. As the formative material of the metal film 371, one may use, for example, Al (aluminum), NiCr (nickel-chrome), Cu (copper), Ni (nickel), Au (gold), Ag (silver) and the like.

With use of a plating method, it is relatively easy to conduct film thickening of the metal film 371, and, in particular, rupture of the metal film 371 in the bent portions is prevented. That is, in the formative process of the metal film 371 by a plating method, the metal film 371 also grows in a planar direction. As a result, in the angled parts of the projection 42 (the boundary positions of the top face 42a and inclined faces 42b and 42c; the boundary positions of the flat plate 41 and the inclined faces 42b and 42c), two adjacent mated metal films 371 that grow in a planar manner combine and integrate. Even in the case where the resin layer 370 ruptures at the aforementioned angled parts or elsewhere, it is possible to form a metal film 371 that does not rupture.

By the foregoing process, wiring 362 composed of a plurality of elongated patterns 380 containing a resin layer 370 and metal film 371 is formed. Thereafter, as shown in FIG. 1, the drive unit 360 is completed by conducting flip mounting of the drive circuits 200A and 200B on top of the wiring 362 and 363.

In the present embodiment, as the metal film 371 is formed using plating treatment in this manner, there is little possibility of rupture even if the wiring 362 adopts a bent structure, and it is easy to ensure the thickness of the conductive film. Film thickening of the metal film 371 is useful in improving the electrical properties of the wiring 362.

Plating treatment enables comprehensive formation of a plurality of metal films, and also easily accommodates more minute detailing of wiring pitch (e.g., 100 μm or less) by combination with photolithography technology.

Furthermore, in the present embodiment, the resin layer 370 is used as the backing film of the metal film 371, with the result that when the aforementioned drive unit 350 is mounted onto the base (the flow path forming substrate 10 and reservoir forming substrate 20), the resin layer 370 functions as a buffer layer that absorbs positional slippage (height irregularities and the like), and contributes to improvement of connection reliability.

Modified Embodiment

Figure 7:
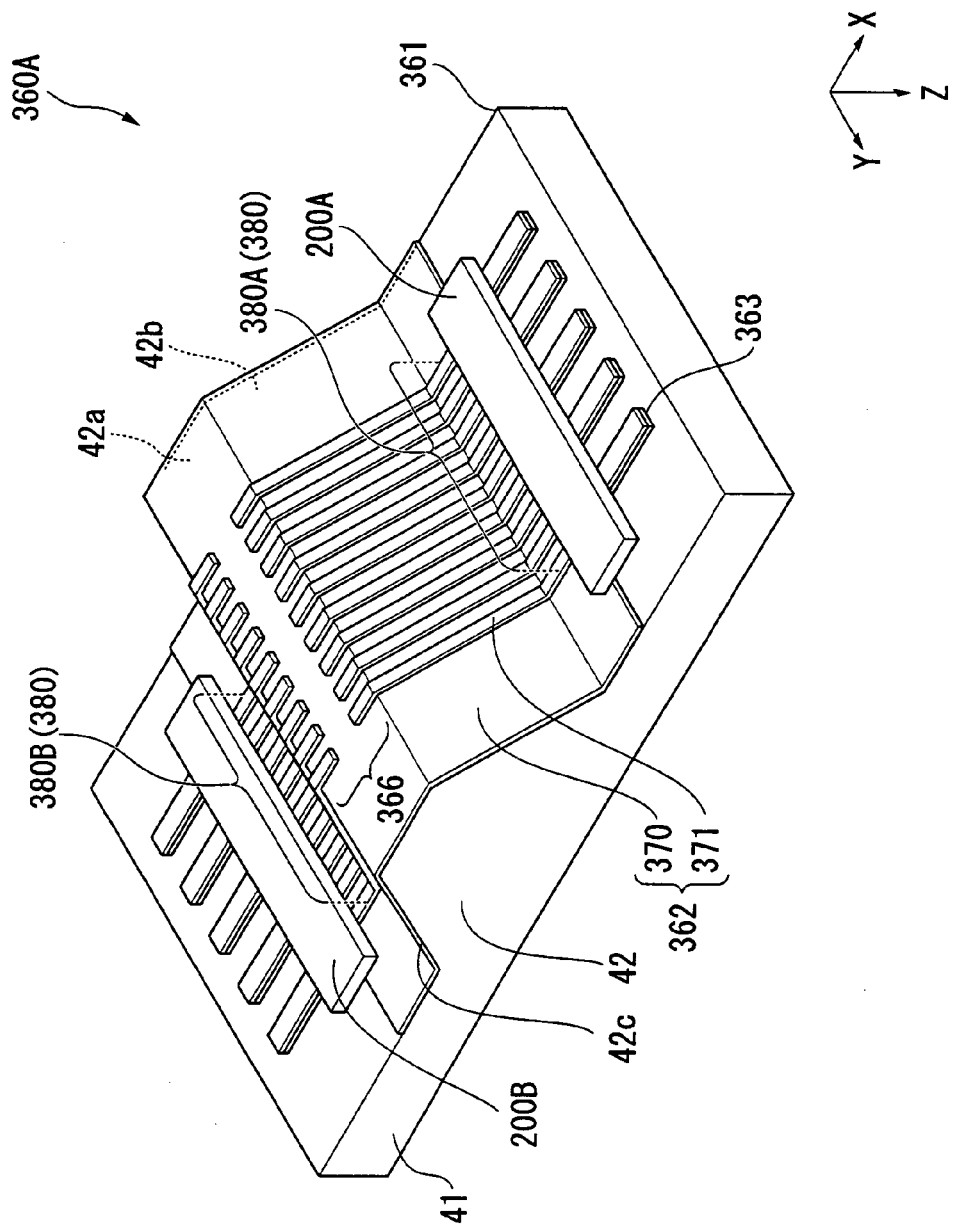
FIG. 7 is an external perspective view showing an example of deformation of the drive unit.

FIG. 7 is an oblique view showing a modified embodiment of the aforementioned drive unit 360. In FIG. 7, components having the same functions as components of the drive unit 360 in FIG. 4 are given the same code numbers, and description thereof is omitted or simplified.

With the drive unit 360A of FIG. 7, in the wiring 362 used for electrical connection, the resin layer 370 is planar, and the metal film 371 is composed of a plurality of elongated patterns 380 formed on top of the resin layer 370.

Specifically, the wiring 362 includes the planar resin layer 370 containing metallic particles, and the metal film 371 composed of a plurality of elongated patterns 380 formed on top of the resin layer 370. That is, with the present embodiment, the plurality of elongated patterns 380 have a monolayer structure composed of the metal film 371. The planar resin layer 370 is formed so as to continuously extend between a prescribed position on the flat plate 41 (the mounting position of the drive circuits 200A and 200B) and the top face 42a of the projection 42. That is, in addition to being arranged on the flat plate 41 and the top face 42a of the projection 42 of the unit base material 361, the resin layer 370 is also arranged on the inclined faces 42b and 42c of the projection 42. The plurality of elongated patterns 380 (the metal film 371) are on top of the planar resin layer 370, and are formed so as to continuously extend between a prescribed position on the flat plate 41 (the mounting position of the drive circuits 200A and 200B) and the top face 42a of the projection 42. Each of the plurality of elongated patterns 380 (the metal film 371) are mutually parallel, and are aligned at a prescribed pitch in the Y direction.

One end (terminal 365) of the elongated pattern group 380A shown in FIG. 7 is connected to the drive circuit 200A, while the other end (terminal 366) is connected to the piezoelectric elements 300 of the first piezoelectric element group corresponding to the first nozzle aperture group 15A. One end (terminal 365) of the elongated pattern group 380B is connected to the drive circuit 200B, while the other end (terminal 366) is connected to the piezoelectric elements 300 of the second piezoelectric element group corresponding to the second nozzle aperture group 15B. The array pitch of the plurality of elongated patterns 380 (metal film 371) on the top face 42a of the projection 42 of the unit base material 361 conforms to the pitch of the upper electrode film 80 that extends into the groove 700 shown in FIG. 3. It is also acceptable to form other films, such as a barrier film for preventing dispersion of the metallic material, or a film for improving adhesion of the resin layer 370, between the surface of the unit base material 361 and the resin layer 370. The metallic particles contained in the resin layer 370 and the formative material of the metal film 371 are identical to the previously described mode of FIG. 4.

In the mode of FIG. 7, in the same way as the mode of FIG. 4, the wiring 362 provided in the unit base material 361 includes the resin layer 370 containing metallic particles and the metal film 371, with the result that the resin layer 370 functions as a buffer layer absorbing positional slippage (height irregularities and the like) when electrically connecting the drive unit 360A and the aforementioned base 10 and 20. That is, when the projection 42 of the drive unit 360A is pressed against the base, gaps are alleviated by the easy deformation of the resin layer 370. As a result, the reliability of connection between the terminals of the drive unit 360A and the base is improved.

In addition, with the mode of FIG. 7, in contrast to the mode of FIG. 4, the resin layer 370 is planar, resulting in simplification of the manufacturing process. Moreover, damage to the unit base material 361 such as cracking is prevented by covering the surface of the unit base material 361 including the projection 42 with the planar resin layer 370.

Manufacturing Method of the Drive Unit

Next, the manufacturing method of the drive unit 360A of FIG. 7 is described with reference to FIGS. 8A to 8C.

Figure 8A:
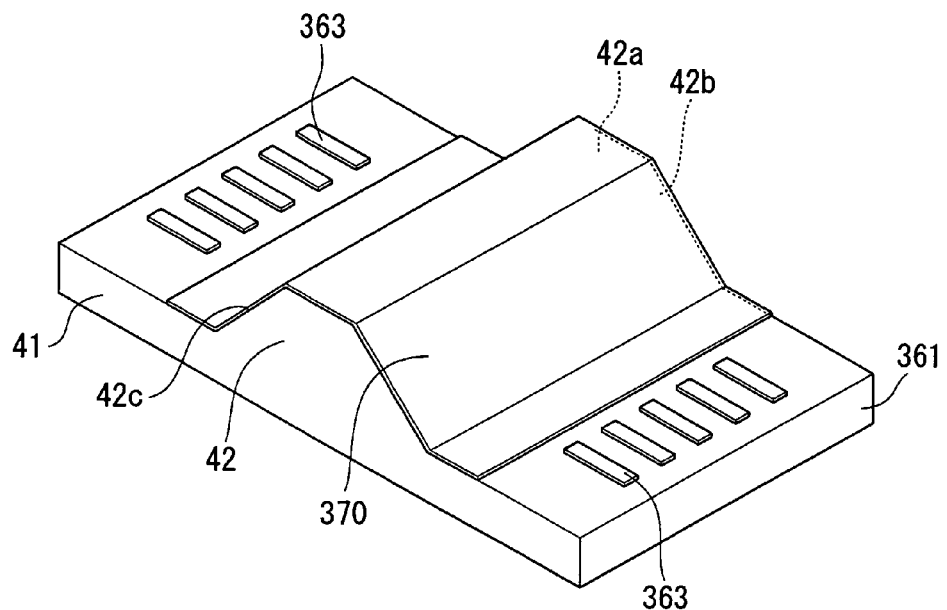
FIGS. 8A, 8B and 8C are explanatory views showing the manufacturing method of the drive unit shown in FIG. 7.

First, as shown in FIG. 8A, the resin layer 370 is disposed on top of the unit base material 361. To dispose the resin layer 370, one may use various application methods such as the spray method, printing method, and liquid droplet ejection method. Prior to disposition of the resin layer 370, it is also acceptable to treat the surface of the unit base material 361 to make it water repellent or affinity. In addition, drying treatment (curing treatment) of the resin layer 370 may be appropriately conducted at a timing of one's choice. As the metallic particles contained in the resin layer 370, one may use, for example, Pd (palladium), Pt (platinum), Au (gold) and the like. In the present embodiment, Pd is used.

In the present embodiment, it is possible to omit the patterning process, as the resin layer 370 to be formed is planar. The formation region of the wiring 363 is subjected to masking as necessary. As a result, the manufacturing process is simplified in comparison to the previous FIG. 6B.

Figure 8B:
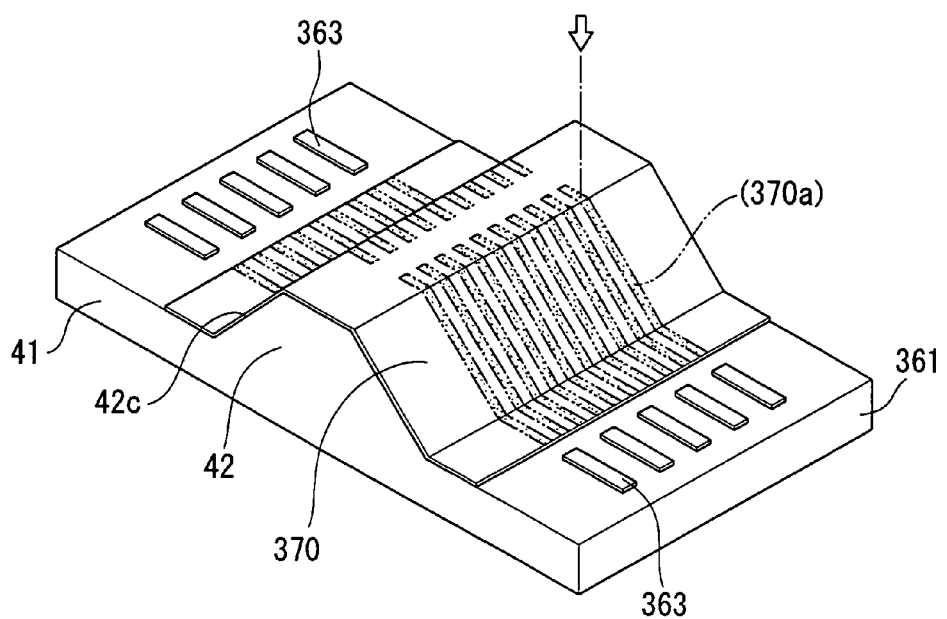

Next, as shown in FIG. 8B, the planar resin layer 370 is formed, after which metallic particles (Pd) are partially exposed in the surface of the resin layer 370 (exposure region 370a). To conduct this exposure treatment, one may use, for example, heat treatment by laser irradiation. Heat treatment by laser irradiation is useful in simplifying treatment and shortening treatment time. By partially melting the resin on the surface of the resin layer 370, the metallic particles (Pd) are exposed on the surface of the resin layer 370. The exposure region of the metallic particles on the resin layer 370 is the formation region of the metal film, and includes a plurality of elongated patterns.

Figure 8C:
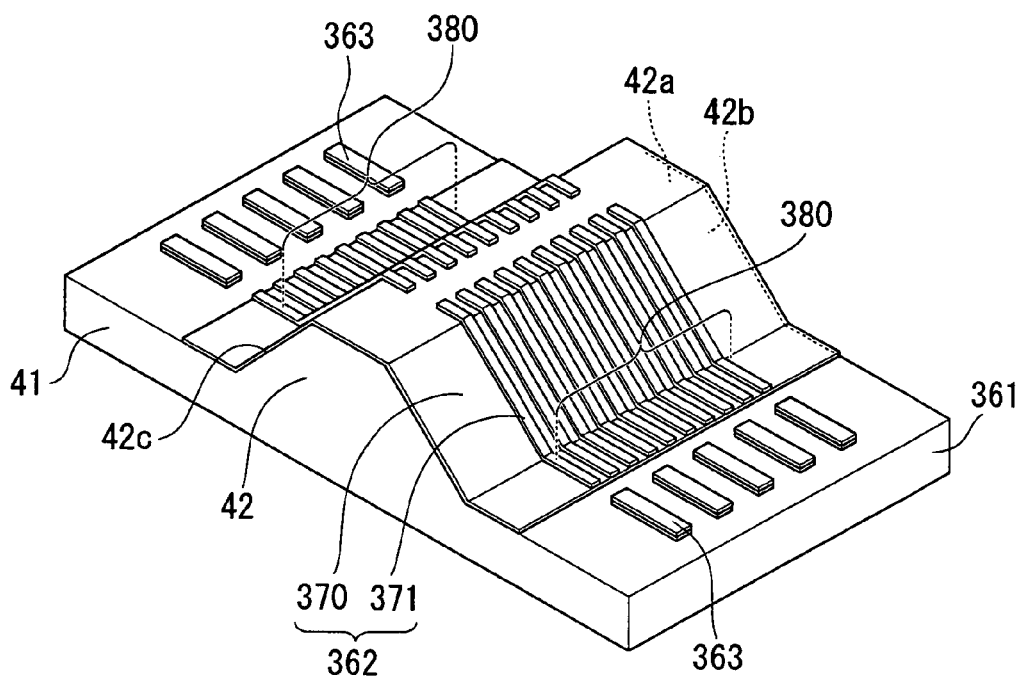

Next, as shown in FIG. 8C, the metal film 371 is formed on the resin layer 370 using a plating method. Various types of plating methods may be applied, such as the non-electrolytic plating method and electrolytic plating method. In the present embodiment, the metal film 371 is selectively formed in the exposure region (370a) of the metallic particles in the resin layer 370. As a result, the metal film 371 composed of the elongated patterns 380 is formed. The metallic particles (Pd) exposed on the surface of the resin layer 370 constitute the growth nucleus of the metal film 371. As the formative material of the metal film 371, one may use, for example, Al (aluminum), NiCr (nickel-chrome), Cu (copper), Ni (nickel), Au (gold), Ag (silver) and the like.

With use of a plating method, it is relatively easy to conduct film thickening of the metal film 371, and, in particular, rupture of the metal film 371 in the bent portions is prevented. That is, in the formative process of the metal film 371 by a plating method, the metal film 371 also grows in a planar direction. In the angled parts of the projection 42 (the boundary positions of the top face 42a and inclined faces 42b and 42c; the boundary positions of the flat plate 41 and the inclined faces 42b and 42c), two adjacent mated metal films 371 that grow in a planar manner combine and integrate. Even in the case where the resin layer 370 ruptures at the aforementioned angled parts or elsewhere, it is possible to form a metal film 371 that does not rupture.

In the foregoing manner, the wiring 362 including the planar resin layer 370 and elongated metal film 371 is formed on top of the unit base material 361. Thereafter, as shown in FIG. 7, the drive unit 360 is completed by flip mounting the drive circuits 200A and 200B onto the wirings 362 and 363.

Thus, in the present embodiment, as the metal film 371 is formed using plating treatment, there is little possibility of rupturing even if the wiring 362 has a bent structure, and it is easy to ensure the thickness of the conductive film. Film thickening of the metal film 371 is useful in improving the electrical properties of the wiring 362.

Furthermore, in the present embodiment, the resin layer 370 is planar, resulting in simplification of the manufacturing process. This resin layer 370 functions as a buffer layer that absorbs positional slippage (height irregularities and the like) when the aforementioned drive unit 360 is mounted onto the base (the flow path forming substrate 10 and reservoir forming substrate 20), contributing to improvement of connection reliability. Due to the planar form of the resin layer 370, the aforementioned buffer effect of the resin layer 370 is reliably demonstrated even when the metal film 371 is thin.

Liquid Droplet Ejection Apparatus

Next, one example of a liquid droplet ejection apparatus provide with the aforementioned liquid droplet ejection head 1 is described with reference to FIG. 9. In the present case, as one example, a description is given of an ink jet recording apparatus provided with the aforementioned liquid droplet ejection head.

The liquid droplet ejection head constitutes part of a recording head unit provided with ink flow paths that communicate with ink cartridges or the like, and is mounted onto the ink jet recording apparatus. As shown in FIG. 9, recording head units 1A and 1B having liquid droplet ejection heads are provided with removable cartridges 2A and 2B that constitute the ink supply means. A carriage 3 on which these recording head units 1A and 1B are mounted is attached to a carriage axis 5, which is attached to the apparatus body 4, so as to freely move in the axial direction.

The recording head units 1A and 1B respectively eject, for example, a black ink composition and a color ink composition. The drive force of a drive motor 6 is transmitted to the carriage 3 via a plurality of gears (not illustrated in the drawing) and a timing belt 7. By means of this transmission, the carriage 3 on which the recording head units 1A and 1B are mounted is moved along the carriage axis 5. On the other hand, a platen 8 is provided in the apparatus body 4 along the carriage axis 5. A recording sheet S which is a recording medium such as paper that is fed by a paper supply roller or the like (not illustrated in the drawing) is conveyed on the platen 8. As the ink jet recording apparatus provided with the aforementioned configuration is provided with the above-described ink jet ejection heads, it is compact, highly reliable, and also low-cost.

Figure 9:
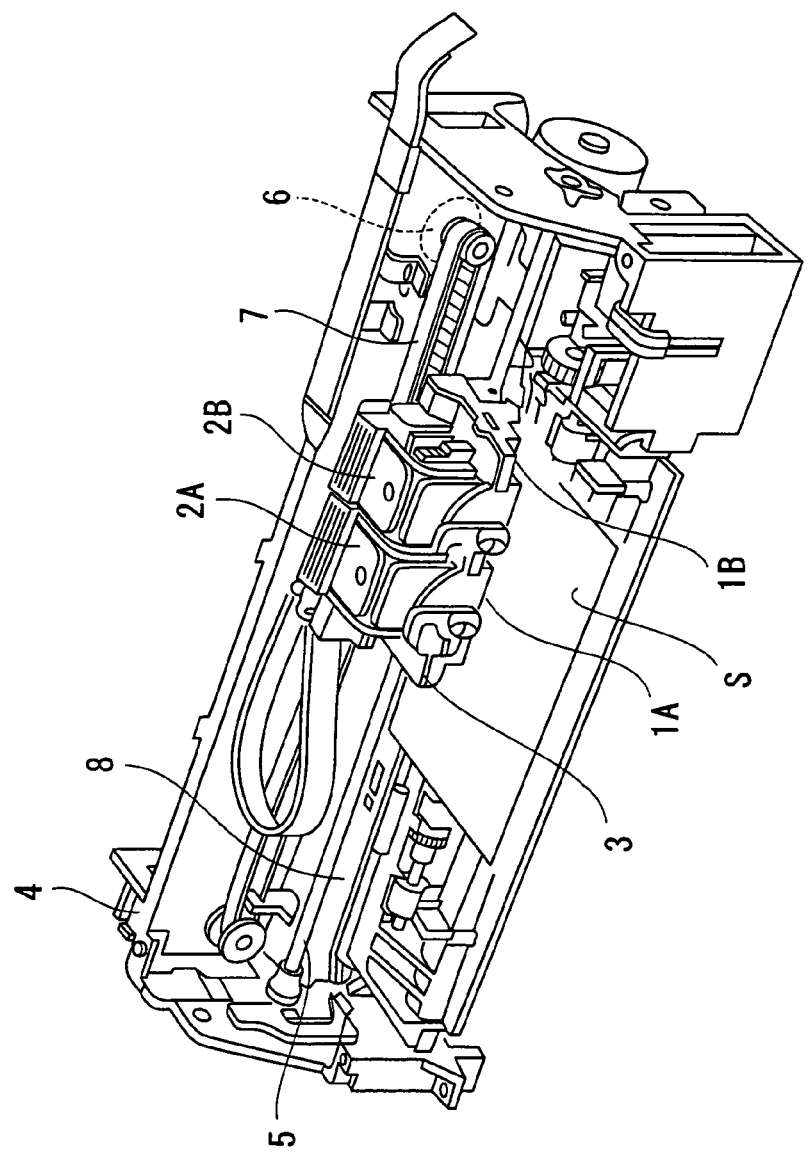
FIG. 9 is a perspective view showing one example of the liquid droplet ejection apparatus.

In FIG. 9, an ink jet recording apparatus serving as a printer unit was shown as one example of the liquid droplet ejection apparatus of the present invention, but the present invention is not limited thereto, and may also be applied to printer units realized by incorporating the pertinent liquid droplet ejection heads. Such printer units are, for example, attached to display devices such as televisions or to input devices such as white boards, and are used to print the images displayed or inputted by the pertinent display device or input device.

In addition, the aforementioned liquid droplet ejection head may also be applied in liquid droplet ejection apparatuses for purposes of forming various types of devices by the liquid phase method. In this mode, as the functional fluid ejected from the liquid droplet ejection head, one uses fluid containing liquid crystal display device formation material for forming liquid crystal display devices, fluid containing organic EL formation material for forming organic EL display devices, fluid containing wiring pattern formation material for forming the wiring patterns of electronic circuits, and the like.

According to the manufacturing process that selectively disposes these functional fluids on the base by the liquid droplet ejection apparatus, as pattern wiring of the functional material is possible without passing through a photolithography process, it is possible to inexpensively manufacture liquid crystal display devices, organic EL devices, circuit boards, and so on.

While preferred embodiments of the invention have been described and illustrated above, it should be understood that these are exemplary of the invention, and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A device mounting structure, comprising:
   a base;
   a unit having a mounting area on which a device is mounted;
   a projection formed on an area of a face of the unit that is different from the mounting area of the unit;
   a first wiring that is disposed on the unit and that continuously extends between a top part of the projection and the mounting area of the unit and that is electrically connected to the device at the mounting area, the first wiring having a resin layer containing metallic particles and a metal film on the resin layer;
   a groove provided in the base, at least part of the projection being inserted into the groove; and
   a second wiring disposed at a bottom part of the groove in the base and being electrically connected to the first wiring.

2. The device mounting structure according to claim 1, wherein the resin layer and the metal film respectively have a plurality of elongated patterns.

3. The device mounting structure according to claim 1, wherein the resin layer is planar, and the metal film has a plurality of elongated patterns formed on the resin layer.

4. The device mounting structure according to claim 1, wherein the metallic particles in the resin layer are material composed from one or more elements selected from the group consisting of Pd, Pt, and Au.

5. The device mounting structure according to claim 1, wherein a formative material of the metal film has material composed of one or more elements selected from the group consisting of Al, NiCr, Cu, Ni, Au, and Ag.

6. The device mounting structure according to claim 1, wherein coefficients of linear expansion of the base and the unit are substantially identical.

7. The device mounting structure according to claim 6, wherein a formative material of the unit is composed of any one selected from the group consisting of ceramics, engineering plastic, glass epoxy, glass, and silicon.

8. An electronic apparatus comprising an electronic device that has been mounted on a base using the device mounting structure according to claim 1.

9. A liquid droplet ejection head having the device mounting structure according to claim 1.

10. The device mounting structure according to claim 1, wherein the projection contracts in a direction away from the face of the unit.

11. The device mounting structure according to claim 10, wherein
   the projection has a top face and a inclined face, and
   the first wiring is disposed on at least the top face and the inclined face.

* * * * *